United States Patent
Gris

[11] Patent Number: 5,953,600
[45] Date of Patent: Sep. 14, 1999

[54] FABRICATION OF BIPOLAR/CMOS INTEGRATED CIRCUITS

[75] Inventor: Yvon Gris, Tullins, France

[73] Assignee: SGS-Thomson Microelectronics S.A, Saint Genis, France

[21] Appl. No.: 08/968,598

[22] Filed: Nov. 13, 1997

[30] Foreign Application Priority Data

Nov. 19, 1996 [FR] France .................................. 96 14412

[51] Int. Cl.$^6$ ............................................. H01L 21/8238
[52] U.S. Cl. ....................... 438/200; 438/202; 438/203; 438/204
[58] Field of Search .................... 438/200, 202, 438/203, 205, 207, 542, 554

[56] References Cited

U.S. PATENT DOCUMENTS

| | | | |
|---|---|---|---|
| 4,752,589 | 6/1988 | Schaber | 438/207 |
| 4,960,726 | 10/1990 | Lechaton et al. | 437/59 |
| 5,015,594 | 5/1991 | Chu et al. | 438/207 |
| 5,045,484 | 9/1991 | Yamada et al. | 437/31 |
| 5,100,815 | 3/1992 | Tsubone et al. | 438/207 |
| 5,192,992 | 3/1993 | Kim et al. | 257/370 |
| 5,238,850 | 8/1993 | Matsunaga et al. | 437/40 |
| 5,321,650 | 6/1994 | Kikuchi et al. | 365/177 |
| 5,416,031 | 5/1995 | Miwa | 437/31 |
| 5,429,959 | 7/1995 | Smayling | 437/34 |
| 5,471,085 | 11/1995 | Ishigaki et al. | 257/370 |
| 5,753,957 | 5/1998 | Watabe | 257/378 |

FOREIGN PATENT DOCUMENTS

A-0 495 329  7/1992  European Pat. Off. ........ H01L 21/82

OTHER PUBLICATIONS

French Search Report from French Patent application 96 14412, filed Nov. 19, 1996.

*Primary Examiner*—Richard A. Booth
*Assistant Examiner*—Christopher Lattin
*Attorney, Agent, or Firm*—Wolf, Greenfield & Sacks, P.C.

[57] ABSTRACT

The present invention relates to a method for fabricating an integrated circuit including complementary MOS transistors and a bipolar transistor of NPN type, including the steps of: forming MOS transistors in an epitaxial layer, coating the entire structure with a double protection layer, forming in an opening of this double layer the emitter-base of the bipolar transistor, a specific collector diffusion being formed in the epitaxial layer under the emitter-base region, and reopening the double protection layer at the locations where it is desired to perform silicidations.

6 Claims, 11 Drawing Sheets

FABRICATION OF BIPOLAR/CMOS INTEGRATED CIRCUITS

BACKGROUND OF THE INVENTION

Field of the Invention

The present invention relates to a line of fabrication of integrated circuits containing, in particular, bipolar and complementary MOS (CMOS) components. This type of line is generally called a BICMOS line.

SUMMARY OF THE INVENTION

An object of the present invention is to provide such a line in which the dimensions of an element designed on a mask can be of a dimension lower than or equal to 0.4 µm, for example, from 0.2 to 0.35 µm.

A more specific object of the present invention is to provide such a line in which the properties of the MOS-type components and those of the bipolar-type components are optimized.

Another object of the present invention is to provide such a line which is compatible with known lines of fabrication of CMOS components.

Another object of the present invention is to provide such a line which is as simple as possible to reach the desired results.

Another object of the present invention is to provide such a line which is adapted to fabricating many components other than the basic components (NPN transistors, N-channel MOS transistors and P-channel MOS transistors).

To achieve these and other objects, the present invention provides a fabrication method in which the buried layers of the bipolar transistors, the CMOS transistors, the bipolar transistors, and then the interconnects are successively implemented, to decouple the characteristics of the MOS transistors from those of the bipolar transistors and optimize each of these components. After the formation of the MOS transistors, a protection layer enables protection of the MOS transistors during the formation of the bipolar transistors. This same protection layer is then used as a mask for the formation of silicided areas.

More specifically, the present invention provides a method for fabricating an integrated circuit including complementary MOS transistors and a bipolar transistor of NPN type, including the following steps:

forming an N-type epitaxial layer on a P-type substrate, a buried layer being provided at least at the location of the bipolar transistor, forming a thick oxide layer at the locations other than the locations of the wells of the MOS transistors, of a collector well region of the bipolar transistor and of a base-emitter region of the bipolar transistor, forming the wells of the MOS transistors and the collector well of the bipolar transistor, forming the insulated gates, the spacers and the sources and drains of the MOS transistors, covering the entire structure with a protection layer including a first layer of silicon oxide and a first layer of silicon nitride, opening the protection layer at the base-emitter location of the bipolar transistor, forming a first P-type doped layer of polysilicon or amorphous silicon and a second layer of encapsulation oxide, opening these last two layers at the center of the emitter-base region of the bipolar transistor, diffusing the doping contained in the first silicon layer into the underlying epitaxial layer, to form the extrinsic base of the bipolar transistor, implanting an N-type collector doping, implanting a P-type doping to form the intrinsic base of the bipolar transistor, depositing a second silicon nitride layer, depositing a second layer of polysilicon, anisotropically etching the second polysilicon layer to leave in place spacers in the vertical portions thereof, and removing the apparent silicon nitride, depositing a third N-type doped polysilicon layer and diffusing the doping to form the emitter of the bipolar transistor, clearing the areas to be silicided, performing a silicidation, depositing a planarized insulating layer, and performing the metallizations.

According to an embodiment of the present invention, the first layer of silicon oxide has a thickness of around 20 nm and the first silicon nitride layer has a thickness of around 30 nm.

According to an embodiment of the present invention, the first silicon layer has a thickness of around 200 nm and the second silicon oxide layer has a thickness of around 300 nm.

According to an embodiment of the present invention, the first silicon layer is obtained by deposition of undoped amorphous silicon, and then by superficial implant of $BF_2$.

According to an embodiment of the present invention, a surface area of the collector well is doped at the same time as the sources and drains of the N-channel MOS transistors.

According to an embodiment of the present invention, the opening of the protection layer at the emitter-base location is of smaller extent than the corresponding opening in the thick oxide.

According to an aspect of the present invention, various steps of the method are used to implement other components.

The present invention provides a central base bipolar transistor wherein the opening of the first silicon layer and of the second encapsulation layer is performed so as to leave in place a central area of these layers.

The present invention provides a lateral PNP transistor wherein the base region corresponds to the epitaxied layer formed above a buried layer of type $N^+$, the emitter region is formed by the same implant as the sources and drains of the P-channel MOS transistors, and the collector region is formed from a portion of the first polysilicon layer.

The present invention provides a MOS transistor resisting to electrostatic discharges including a MOS transistor, the contact drain of which is recovered by a portion of the first polysilicon layer extending above a portion of the substrate and also used to establish a diffusion continuing the drain area The present invention provides a high voltage MOS transistor formed in an insulated P well, such that its gate insulating layer corresponds to a portion of the protection layer including a first layer of silicon oxide and a first layer of silicon nitride, its gate is formed from the first layer of doped polysilicon and is coated with the second layer of encapsulation oxide, its gate is laterally framed with spacers formed by the second silicon nitride layer and the second polysilicon layer, and its source and drain contact recovery regions are formed of areas doped by diffusion from a deposition of a portion of the third polysilicon layer.

The present invention provides an EPROM transistor such that its first gate, the associated spacers and its source and drain are formed at the same time as those of the MOS transistors, its insulator between gates corresponds to a portion of the protection layer, and its second gate corresponds to the first polysilicon layer.

These and other objects, features and advantages of the present invention, will be discussed in detail in the following non-limiting description of specific embodiments, in connection with the accompanying drawings.

DETAILED DESCRIPTION

As usual in the field of the representation of semiconductor components, the various cross-sectional views are not drawn to scale. The lateral and crosswise dimensions of the various layers and regions are arbitrarily enlarged or reduced to facilitate the drawings.

Generally in the following description, the left side of FIGS. 1 to 11 in which is formed a CMOS component will be designated as the CMOS side and the right side of these drawings in which is formed an NPN-type bipolar transistor will be designated as the bipolar side. In the following, the fabrication of an N-channel MOS transistor, of a P-channel MOS transistor and of an NPN-type bipolar transistor is described. Of course, in a practical implementation, many identical components will be simultaneously formed, as well as possibly other types of elementary components.

According to an aspect of the present invention, the initial steps correspond to known steps of fabrication of CMOS integrated circuits of very small dimensions (minimum dimension, or gate dimension, under 0.35 μm).

Figure 1:
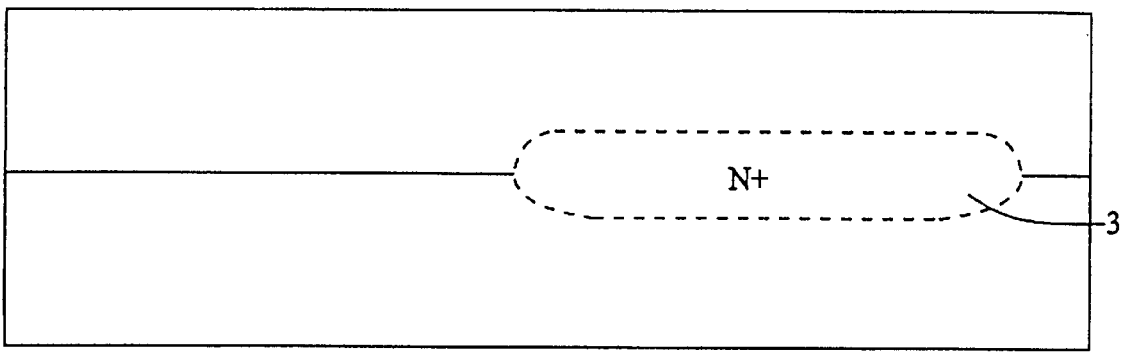
FIGS. 1 to 11 are simplified cross-sectional views illustrating successive steps of fabrication of an embodiment of an N-channel MOS transistor, of a P-channel MOS transistor, and of an NPN-type bipolar transistor according to the present invention.

As shown in FIG. 1, an N-type epitaxial layer 2 is formed on an initial P-type substrate 1. The epitaxial layer is relatively thin, for example, of a thickness of about 1 to 1.2 μm.

Before the growth of the epitaxial layer, if desired, buried layers of appropriate types are provided in the areas where N or P wells of CMOS transistors are to be formed and a buried layer 3 of type $N^+$ is formed on the bipolar side.

Figure 2:
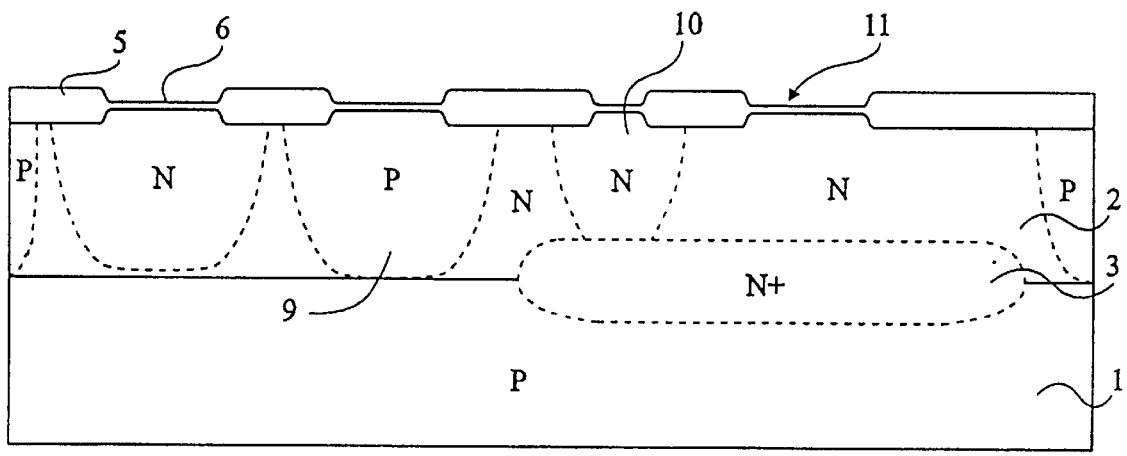

As shown in FIG. 2, on the MOS side, the regions of the MOS transistors are limited by openings in a thick oxide layer 5 formed by any known technique. Through the thick oxide or a thin oxide region 6 formed in the openings, N-type wells 8 and P-type wells 9 are conventionally implanted. These wells are for example formed by a succession of three implants, one of which runs through thick oxide 5 in unmasked regions. These N and P wells are respectively meant for P-channel MOS transistors and N-channel MOS transistors. The surface doping level (some $10^{16}$ at./cm$^3$) determines the threshold voltage of the transistors. In the general case, the P wells (associated with a $P^+$ buried layer) are in electrical contact with the P substrate. It could be, however, provided to form at least some of the P wells on an N-type buried layer. The N wells are completely insulated since they emerge in the P substrate and they are laterally insulated by P regions formed like the P wells.

Simultaneously, on the bipolar side, a region in which a drive-in for recovering the collector contact or collector well 10 joining buried layer 3 will be formed is delimited in thick oxide 5. This collector well is formed by at least some of the implants performed to form N-type well 8, or by a specific N-type implant. This collector well can also be formed subsequently at the same time as the sources and drains of the N-channel MOS transistors. Also, an area 11 in which the base and the emitter of an NPN-type bipolar transistor will be formed is delimited in the thick oxide. During the various implants of N and P wells, this area 11 is masked.

Figure 3:
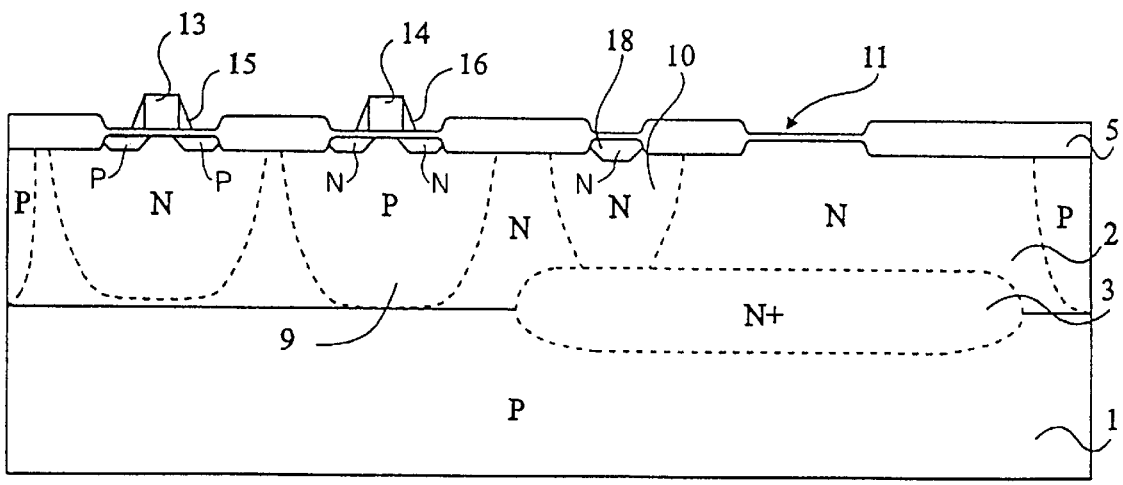

As shown in FIG. 3, on the MOS side, insulated gates 13 and 14 of the MOS transistors are conventionally formed; first implants are performed (LDD); spacers 15 and 16 are formed; and drain and source implants are performed. In well 8, the implants are of type P and, in well 9, the implants are of type N. Concurrently to the making of the source and drain implants of the N-channel transistors in the P wells, a highly-doped N-type diffusion 18 is performed at the surface of collector well 10 to improve the subsequent contact making.

Then, a fast thermal annealing is performed (1025° C.). After this step, at the end of which most of the MOS transistors has been made (except for the possible contact making silicidations and the metallizations), the NPN-type bipolar transistor is made.

Figure 4:
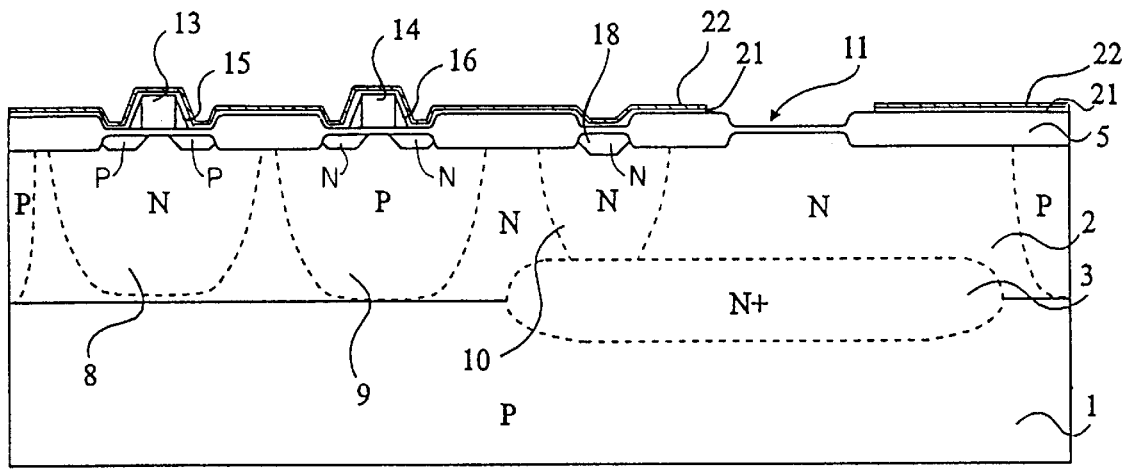

At the step illustrated in FIG. 4, a double protection layer including a silicon oxide layer 21 having, for example, a width of about 20 nm followed by a silicon nitride layer 22 having, for example, a thickness of about 30 nm is deposited over the entire structure, by chemical vapor deposition. This layer 21–22 is opened in the area 11 where it is desired to form the emitter-base region of a bipolar transistor. It should be noted that the positioning of this opening is not critical since it stops on thick oxide regions.

Figure 5:
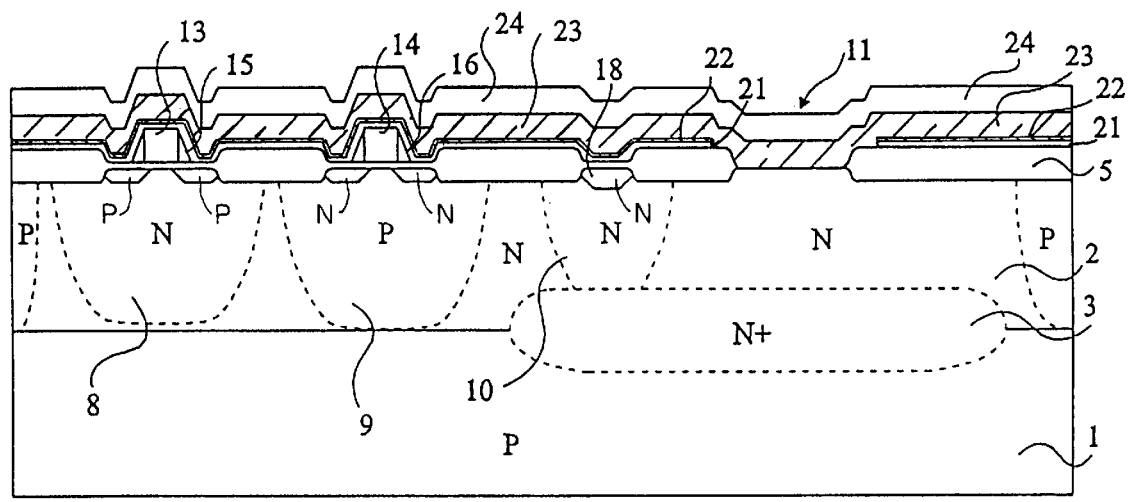

At the step illustrated in FIG. 5, a silicon layer 23 having, for example, a width of around 200 nm followed by an encapsulation oxide 24 having, for example, a thickness of about 300 nm are deposited over the entire structure.

Silicon layer 23 must be P-type doped since it will be used, as it will be seen hereafter, as a doping source for the extrinsic base of the NPN transistor and will be called the base polysilicon. Although it is referred to as the base polysilicon, it could also be any type of deposited silicon layer, for example, amorphous silicon. Preferably, according to an aspect of the present invention, an undoped polysilicon or amorphous silicon layer 23 is first deposited, after which a P-type doping is implanted in this layer. Preferably, boron is implanted in the form of very high dose low energy $BF_2$ ($10^{15}$ to $10^{16}$ at/cm$^2$) so that the implanted boron concentrates in the upper part of the layer, avoiding implantation of boron in the underlying silicon substrate in region 11.

Figure 6:
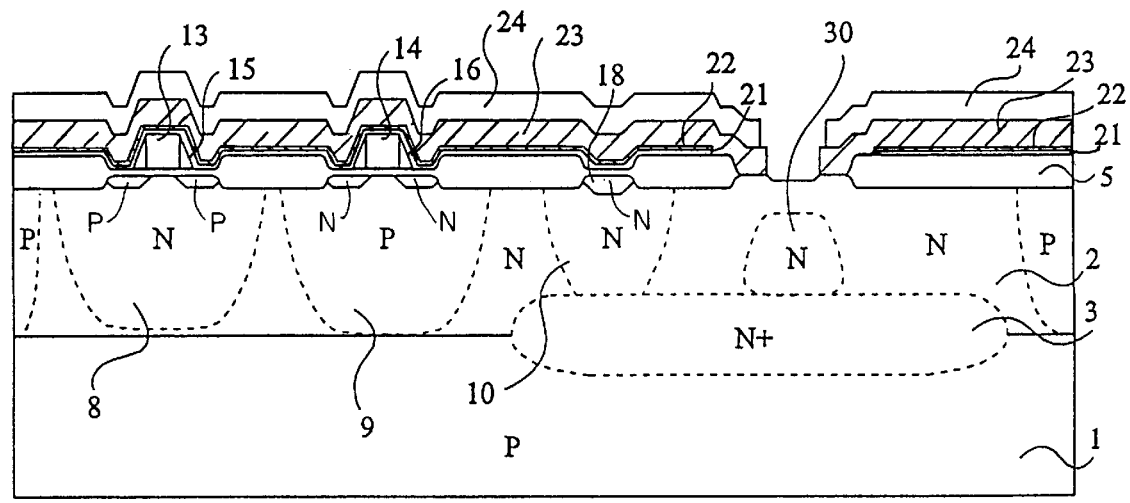

At the step illustrated in FIG. 6, an opening is provided in layers 24 and 23 in the central portion of region 11. This opening has for example a width included between 0.4 and 0.8 μm and penetrates into the monosilicon by less than 50 μm. Then, an N-type implant is performed to define the collector 30 of the NPN transistor. The collector is thus self-aligned on the opening. The N implant is performed at medium dose and high energy (for example, $10^{12}$ to $10^{14}$ at./cm$^2$ under 500 keV). Thus, an effective collector region of limited lateral extent, substantially equal to that of the intrinsic base which is formed afterwards, is obtained. This contributes to obtaining an NPN transistor having low stray capacitance between the collector and the extrinsic base. The implant is optimized (for example, by successive implants) so that the contour of the collector provides the best possible compromise between, on the one hand, the collector resistance and the time of transit through this collector and, on the other hand, obtaining high enough emitter-collector and base-collector breakdown voltages (typically 4 volts) and of a low base-collector capacitance. It should also be noted that this collector implant enables to previously choose an epitaxial layer 2 having a doping and a thickness proper for optimizing the CMOS transistors and then independently optimizing the characteristics of the NPN transistors. Especially, this epitaxial layer can be thicker than if it had to be directly used as a collector layer of the NPN transistor.

Figure 7:
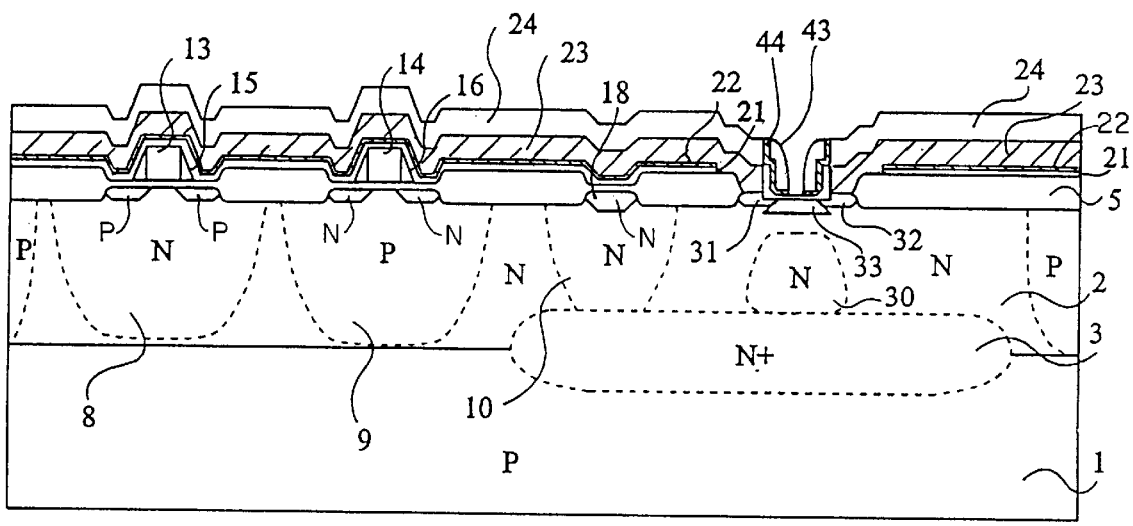

As shown in FIG. 7, after removing the masking resist, a thermal oxidation is performed, during which a thin thermal oxide layer 31 of a thickness of around 5 to 10 nm forms and during which the boron contained in polysilicon layer 23 starts diffusing in the underlying epitaxial layer to form an extrinsic base region 32 having, for example, a junction depth of around 100 μm. This diffusion is then completed by the final annealing of the bipolar structure. A P-type implant is then performed through oxide 31 to form an intrinsic base region 33 at the center of the opening in layers 23 and 24. This intrinsic base is preferably implanted with low energy boron (for example, $10^{13}$ at./cm$^2$ under 5 keV). The contact with polysilicon 23 results from the lateral diffusion of the boron of the polysilicon.

A uniform deposition of a thin silicon nitride layer (30 nm) coated with a polysilicon layer (100 nm) is then performed. The polysilicon layer is then etched anisotropically so that there only remains spacers 43 on the sides of the opening made in layers 23 and 24. Then, a uniform etching of the silicon nitride is performed, so that the silicon nitride remains in place only in the regions 44 where it is protected from the etching (chemical or plasma etching) by polysilicon spacers 43. Nitride 44 and spacers 43 altogether thus define a smaller opening than the opening initially formed in layers 23 and 24 for the definition of the intrinsic base. This smaller opening is the emitter opening. If the spacers have a width of around 150 nm each, this small opening has a width of around 0.5 μm.

Figure 8:
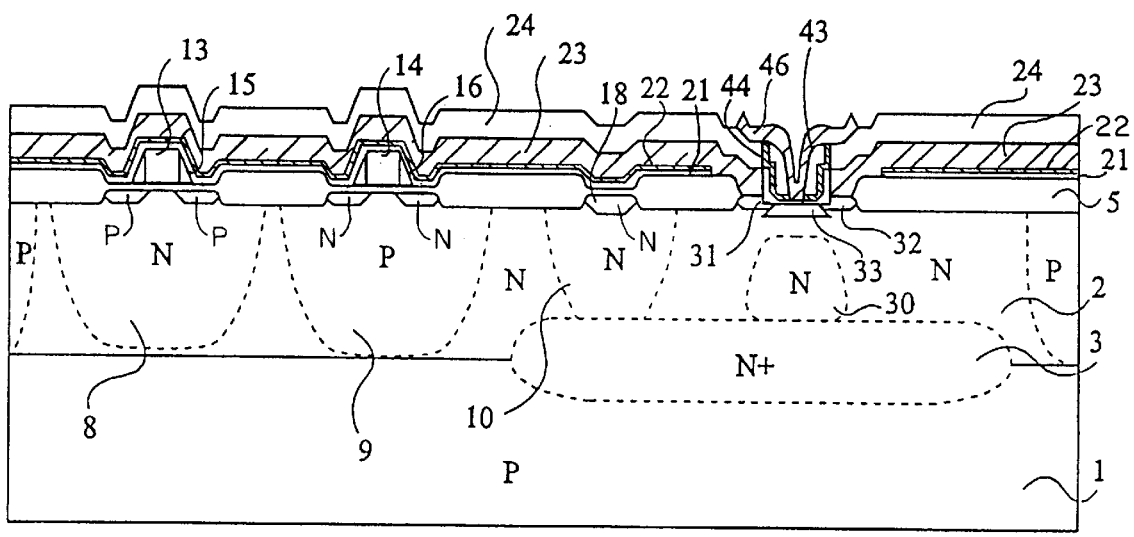

At the step illustrated in FIG. 8, the thin oxide layer 31 at the bottom of the opening, which had been used as a protective layer during the emitter implant (boron) and as an etching stop for the silicon nitride layer, is carefully cleaned, for example in a bath of diluted fluorhidric acid. A highly-doped N-type polysilicon layer is deposited, and then etched to leave in place a region 46. Regions of the doped polysilicon layer 46 can be maintained in place in selected locations to form, for example, capacitors between regions of this polysilicon 46 and regions of base polysilicon 23.

It should be noted that, during the fabrication steps of the NPN transistors, the regions where the MOS transistors have been formed are protected by oxide layer 21, nitride layer 22, base polysilicon layer 23, and oxide layer 24. This stacking of layers ensures very efficient protection against any possible contamination and against any crossing by the dopings implanted for the formation of the bipolar transistor.

Figure 9:
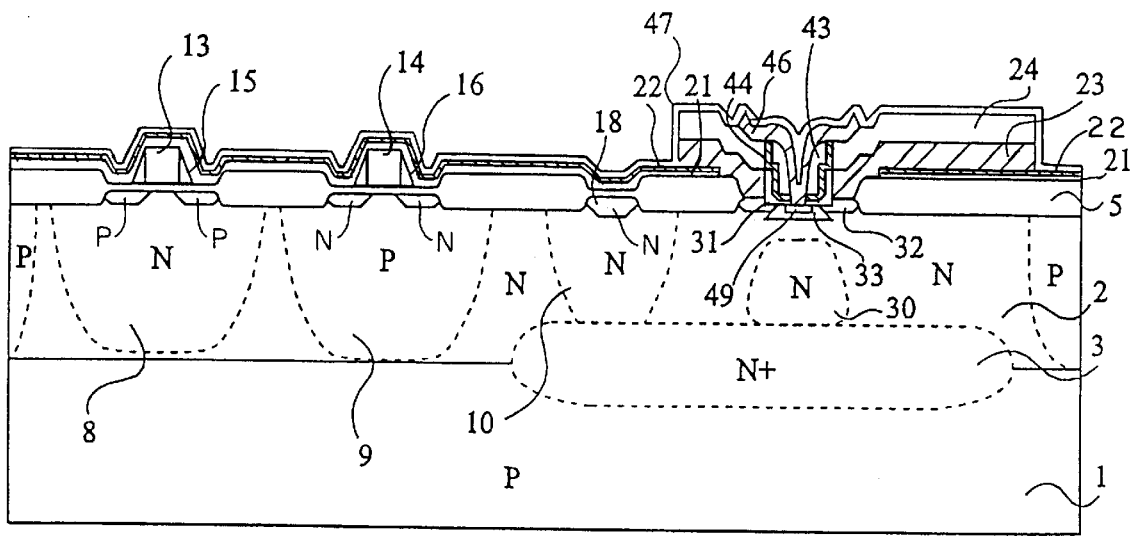

At the step illustrated in FIG. 9, the oxide and base polysilicon layers 24 and 23 are removed outside the emitter-base region of the bipolar transistor and other possible regions including devices using portions of base polysilicon layer 23 (resistors, capacitors . . .). Then, an encapsulation silicon oxide layer 47 is deposited.

Afterwards, an annealing is performed to have the dopant contained in polysilicon layer 46 penetrate into the center of the base region of the transistor to form its N-type emitter 49. The annealings associated with the bipolar transistor ensure an electric reactivation of the dopings and lead to junction depths of about 60 nm. The annealings are of the fast thermal annealing type and/or furnace annealing type. The thermal processing (30 s, 1000° C.) is lighter than for the MOS transistors which are thus not affected.

Figure 10:
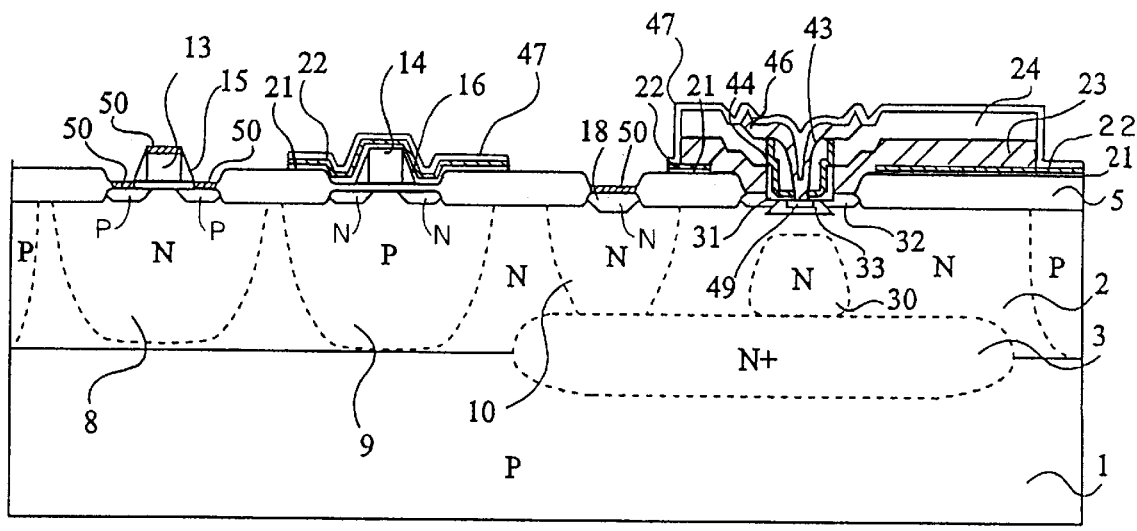

At the step illustrated in FIG. 10, the encapsulation silicon oxide, silicon nitride, and protection silicon oxide layers 47, 22, and 21 are removed above the active and/or polysilicon layers which are desired to be silicided, for example the P-channel MOS transistor and the collector well of the bipolar transistor. A metal silicide 50 is formed selectively above the exposed monosilicon and polysilicon layers.

Figure 11:
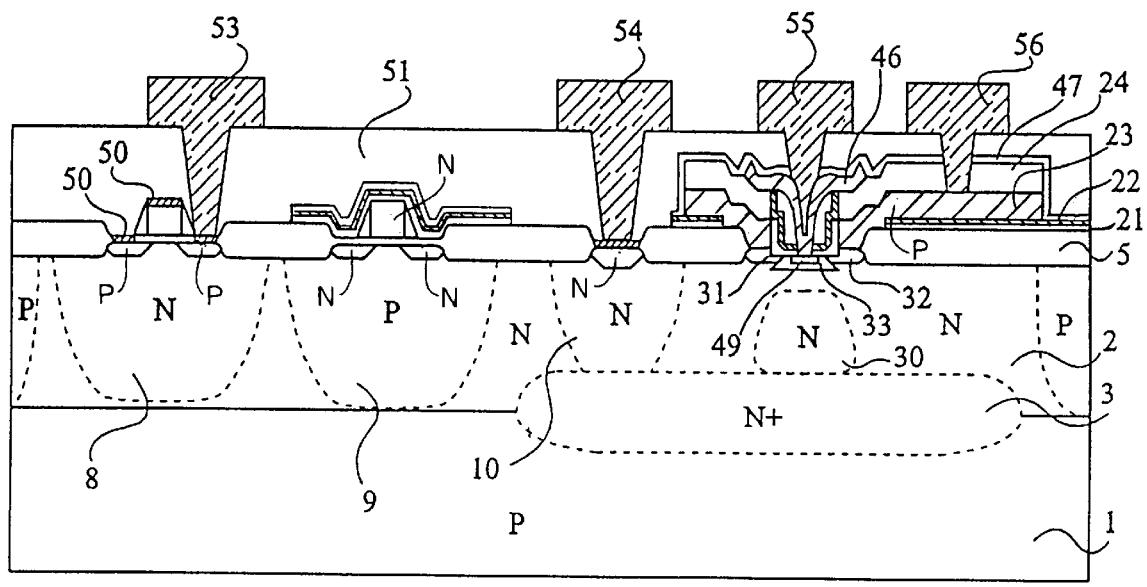

At the step illustrated in FIG. 11, an insulating planarization layer 51 is deposited by any known method, for example, by deposition of a boron and phosphorus-doped glass layer (BPSG) and is annealed, then this layer and possible underlying layers are opened at the locations where contacts are desired to be made. Only some contacts have been shown since, as it is well known, the contacts are not necessarily made directly above the effective areas but possibly on crosswise extensions of conductive regions extending from these effective areas. Thus, in FIG. 11, only one drain contact 53 of a P-channel MOS transistor, one collector contact 54, one emitter contact 55 and one base contact 56 of the bipolar transistor have been shown.

Figure 12A:
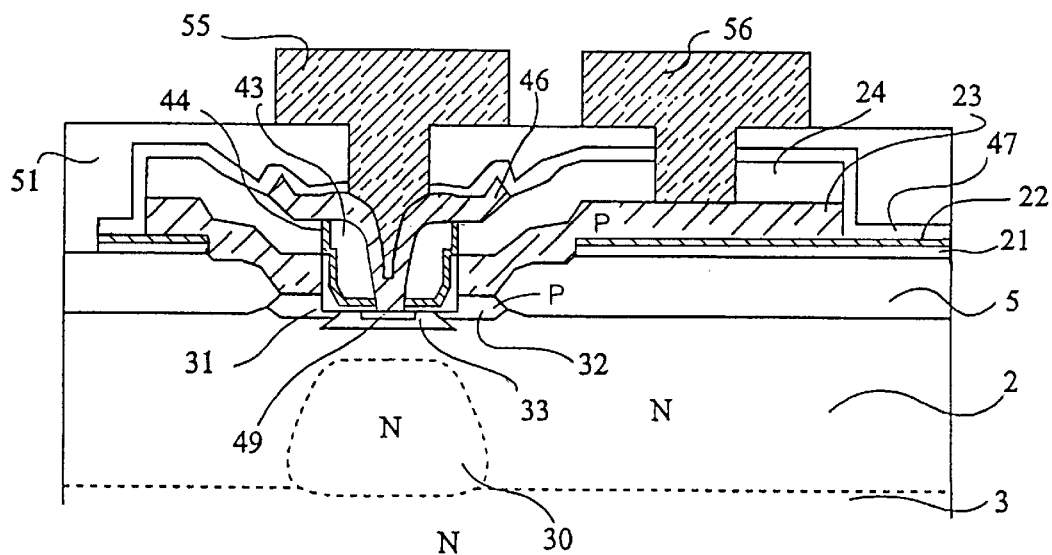
FIG. 12A is an enlarged view of a bipolar transistor of NPN type obtained according to the present invention.

FIG. 12A corresponds to the bipolar side of FIG. 11 and shows the emitter-base region of the bipolar transistor at a larger scale.

In a specific embodiment, and to give an example of orders of magnitude, it may be chosen to implement a structure with the following numeric data (where e designates a width, and Cs a superficial concentration or a mean concentration for a homogeneous layer):

substrate 1: Cs=$10^{15}$ at./cm$^3$,
epi layer 2: Cs=$10^{16}$ at./cm$^3$, e=0.8 to 1.4 μm,
buried layer 3: Cs=$10^{20}$ at./cm$^3$,
oxide 5: e=0.5 μm,
N or P sources and drains: Cs=$10^{20}$ at./cm$^3$, e=0.15 μm.

The fabrication process according to the present invention, while being perfectly compatible with existing lines of fabrication of high definition CMOS transistors, enables implementation of a bipolar transistor, the collector, intrinsic base, and emitter regions of which are self-aligned.

This bipolar transistor has many advantages. Its performance does not suffer from the presence of the CMOS transistors. It can, in particular, be used at radiofrequencies (cut-off frequency higher than 40 GHz). The very high transconductance and the low noise of the bipolar transistor make it useful in analog applications. In particular, the base contact (in P$^+$ polysilicon) enables an advantageous and large reduction of the base resistance, which results in an advantageous improvement in RF noise factor. Thus, the bipolar transistor can be used instead of some AsGa transistors with a lower cost and the possibility of associating this transistor on the same chip with a high-performance CMOS circuit.

It will be recalled that the method according to the present invention has, in particular, the following characteristics:

it includes three independent phases: making the CMOS transistors, making the bipolar transistors, and making the silicidations and interconnects;

all protection layers 21, 22, are used several times, especially, in a first phase, to protect the MOS transistors during the implementation of the bipolar transistors and, in a second phase, to protect the elements which are not desired to be silicided;

the thermal processes to be applied to the bipolar transistor are "cold" with respect to the MOS transistors; this essentially results from the fact that most diffusions of the bipolar transistors result from doped polysilicon layers;

the base polysilicon is cut up in two runs, localized spacers being provided only around the emitter aperture; and as will be described hereafter, this method is well adapted to the implementation of various primary components other than N-channel and P-channel MOS transistors and NPN-type bipolar transistors.

A

SILICIDATION OF THE BASE AND/OR OF THE EMITTER

As indicated hereabove, once the bipolar transistor has been formed and annealed, the standard CMOS process is resumed with a self-aligned silicidation (FIG. 10). This selective silicidation requires a stripping of the silicon to be silicided, followed by a metal deposition (for example, of titanium, Ti) and an annealing. During this annealing, the metal deposition interacts with the silicon to form a silicide (for example, TiSi$_2$). The metal that has not reacted, Ti, is selectively removed in a chemical bath without using a mask. The important thing for this silicidation step is to uncover areas of monosilicon or polysilicon.

The described method is compatible with a silicidation of the base and/or of the emitter of the bipolar transistor. These steps are entirely compatible with the steps previously known in CMOS, by only adding additional constraints to the methods used and not additional process steps.

The opening of the silicidation mask is performed for the CMOS technology by etching the protection layer including layers 21 and 22 and called SIPROT (see FIG. 10). On the CMOS side, layers 47, 22, and 21 have to be respectively etched. On the bipolar side, layer 47 will be etched with a stop on polysilicon 46 for the emitter region, and layers 47 and 24 will be etched with a stop on base polysilicon 23 for the base region.

According to the etching methods, it is possible to overetch oxide 47 (100 nm) above the CMOS region by the thickness of oxide 24 (300 nm) without significantly attacking nitride 22 and emitter polysilicon 46. Similarly, the etching of nitride 22 (30 nm) will be practically performed without overetching uncovered polysilicons 23 and 46. Finally, the etching of oxide 21 is performed without overetching layers 23 and 46.

Figure 12B:
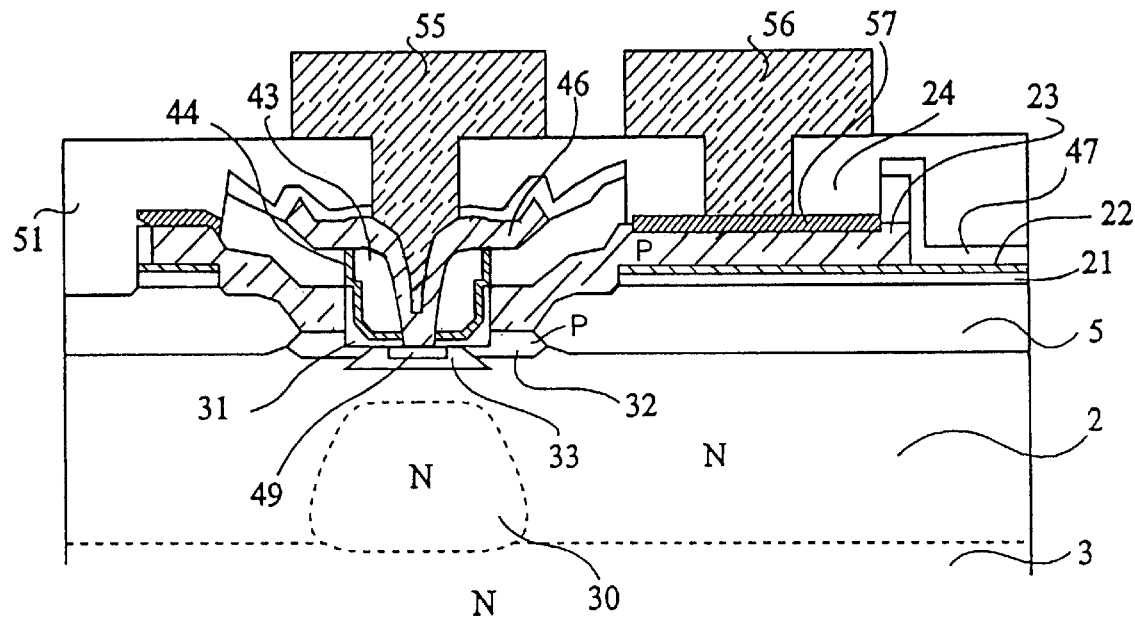
FIGS. 12B to 12E shows various alternative embodiments of the structure of FIG. 12A.
Figure 12C:
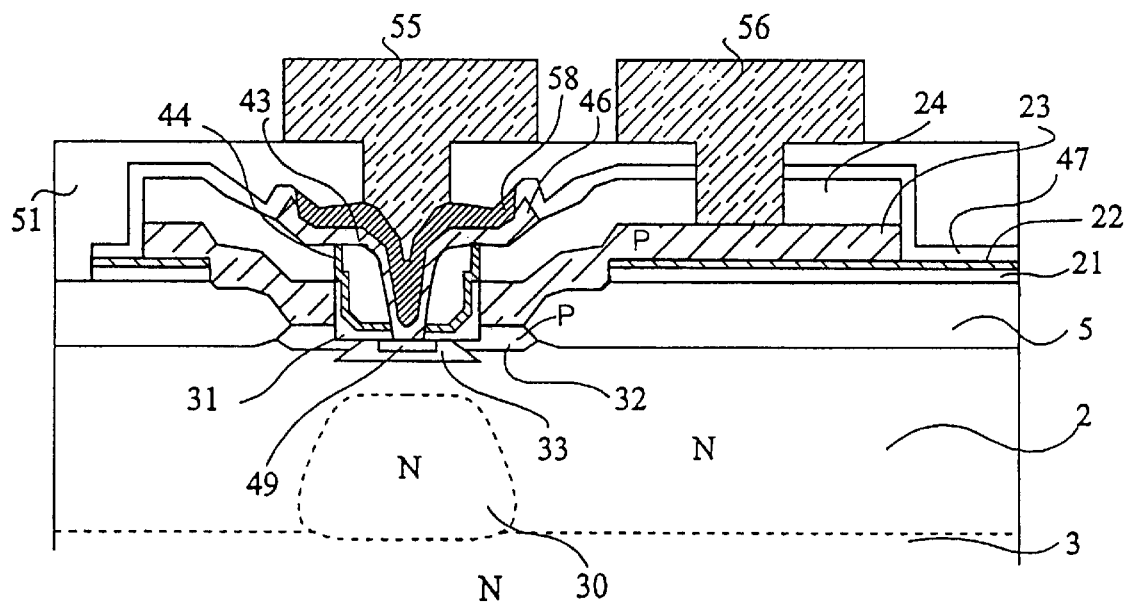
Figure 12D:
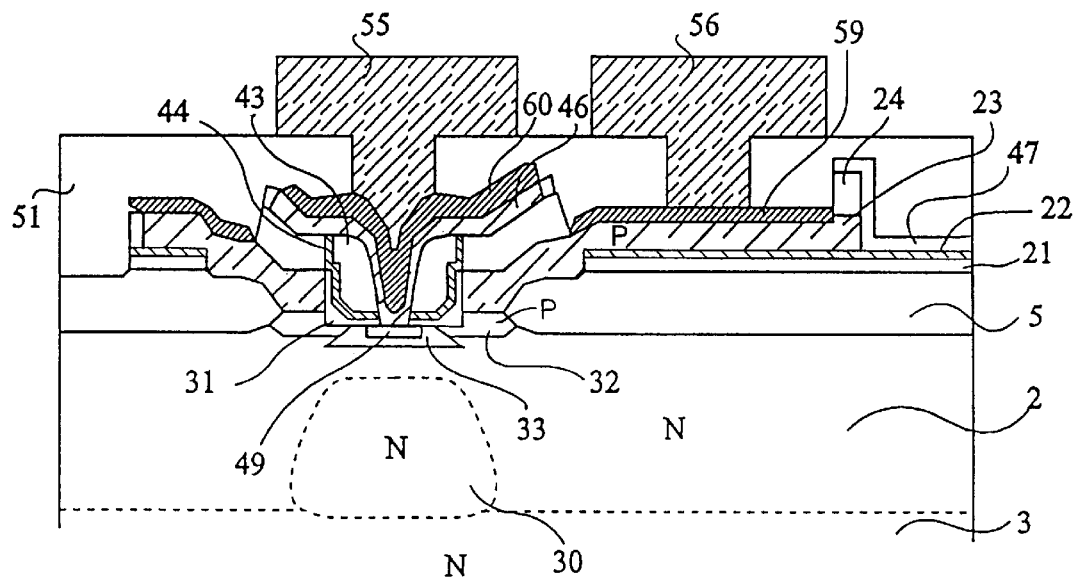

The base polysilicon can thus be selectively opened to form silicide 57 (FIG. 12B), the emitter polysilicon can be opened to form a silicide 58 (FIG. 12C). A self-aligned silicidation is even easily implementable (FIG. 12D) to form silicides 59, 60. Indeed, the large size of layer 24 (300 nm) enables implementation of a vertical spacer avoiding short-circuits of the base and emitter silicides.

The siliciding of the emitter enables making contacts compatible with the CMOS method, and to decrease the emitter contact resistance.

The siliciding of the base is very beneficial for base resistance (that results in noise reduction) and for the quality of the contacts.

B

UNWALLED BASE TRANSISTOR

The breakdown voltage value between the base and the collector is a critical parameter for this technology. Indeed, the more epitaxial layer 2 has a small thickness and is highly doped, the faster the performance is at the expense of the emitter-collector and collector-base breakdown voltage values, VB$_{CE0}$ and VB$_{CB0}$, of the device. These breakdown voltage values have to remain higher than the supply voltage (3.3 volts).

Now, the connection point between thick oxide 5 and P-doped silicon 32 of the extrinsic base of the bipolar transistor is a weak point for the breakdown voltage, especially because of the constraints in the silicon and due to the "topologic" deformation of the potential lines. It is thus valuable to implement bases P in the monosilicon, unwalled by the thick oxide, in order to increase the breakdown voltage.

Thus, according to an alternative of the present invention, at the step illustrated in FIG. 4, instead of stopping the opening of layers 21, 22, on thick oxide layer 5 within the opening 11 previously defined herein, an opening internal to opening 11 can be defined in layers 21, 22.

Figure 12E:
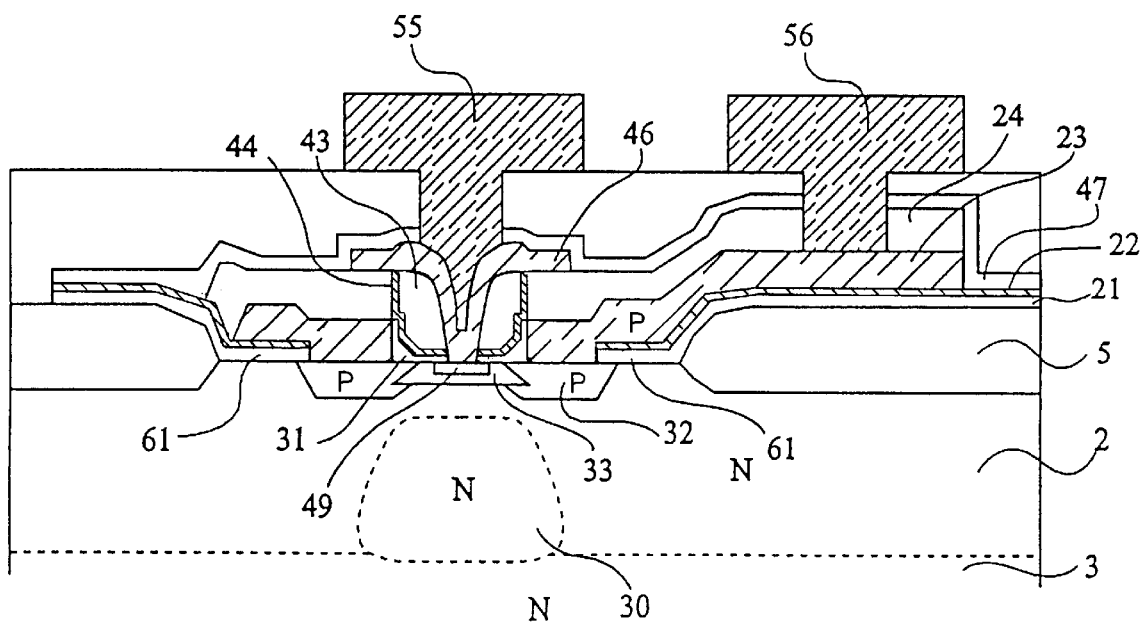

The result of this variant is illustrated in FIG. 12E where the internal continuation of regions 21, 22, is designated by reference 61.

This alternative has multiple consequences. The opening becomes critical, but a better definition of the base polysilicon/monosilicon contact area is obtained; the contact surface between the base polysilicon and the monosilicon can be decreased; the capacitance between the extrinsic base and the collector is lower; the low frequency noise is reduced and breakdown voltage value VB$_{CB0}$ is higher.

C

CENTRAL BASE NPN TRANSISTOR

Figure 13A:
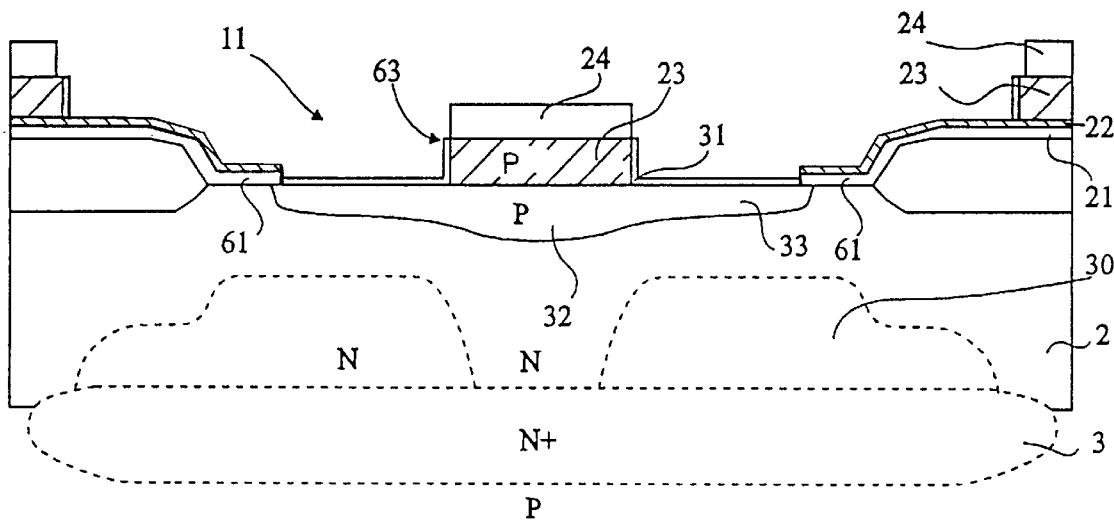
FIGS. 13A to 13C show successive steps of fabrication of an alternative embodiment, having a central base, of an NPN transistor which can be implemented by using the fabrication method according to the present invention.
Figure 13B:
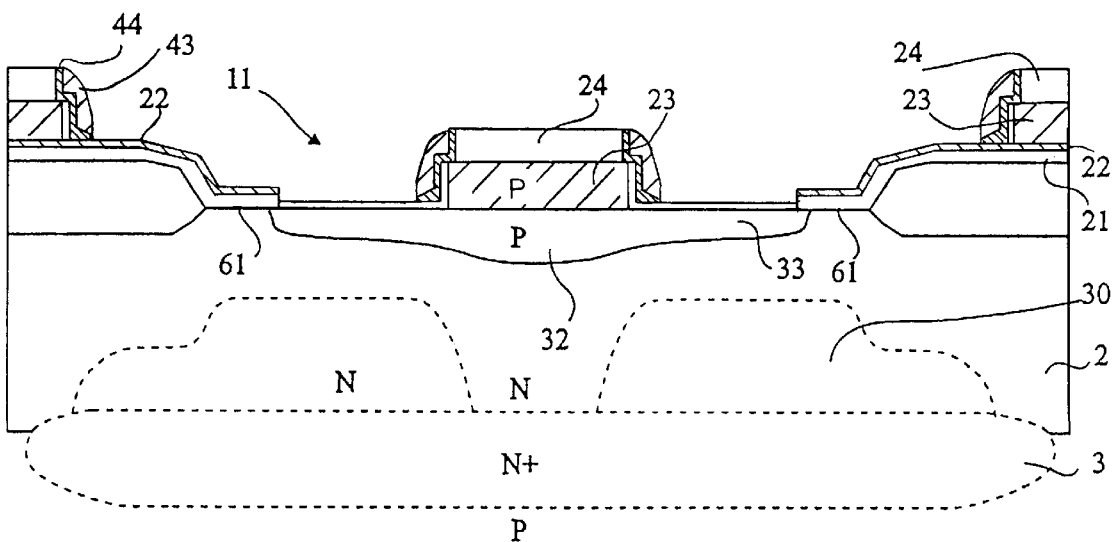
Figure 13C:
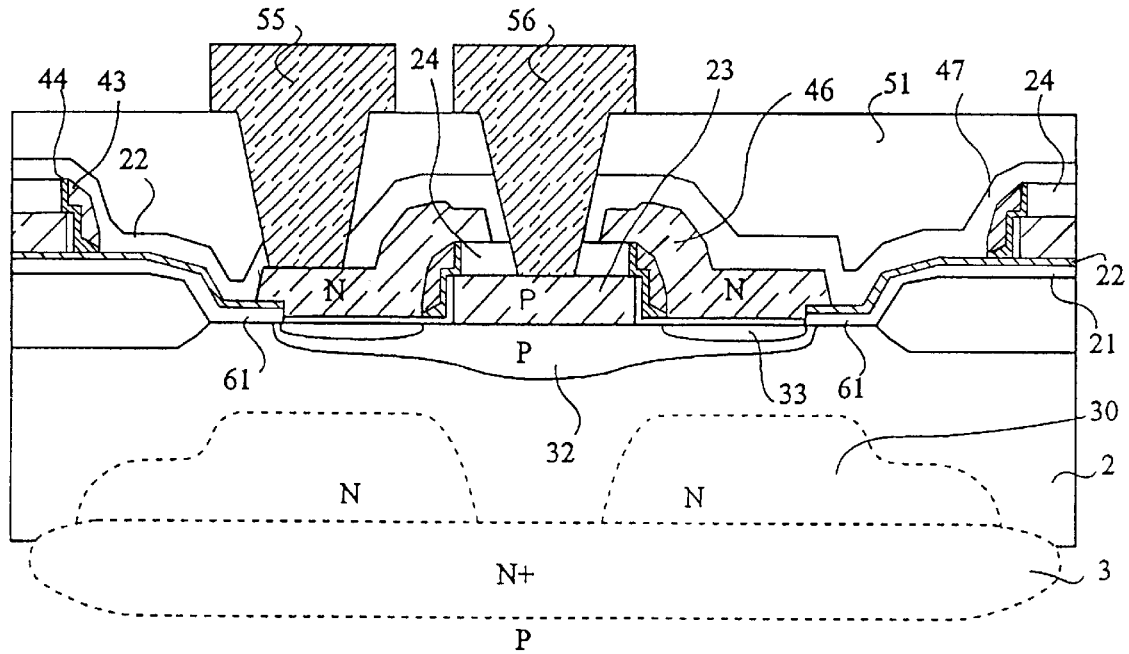

FIGS. 13A to 13C show steps of fabrication of a central base NPN transistor structure compatible with the line according to the present invention.

FIG. 13A corresponds to a step of the fabrication method subsequent to that illustrated in FIG. 5. Instead, as shown in FIG. 6, of clearing silicon layer 23 and encapsulation oxide 24 at the center of opening 11 defining the emitter and base regions of transistor NPN, a portion 63 of layers 23 and 24 is left in place substantially at the center of opening 11 (which, in the embodiment shown, is illustrated in the context of the unwalled alternative described in relation with FIG. 12E). The steps described in relation with FIG. 6 are then performed, that is:

implant of collector 30 which then is ring-shaped, formation of a thermal oxide layer 31, diffusion of the boron contained in polysilicon 23 to form central extrinsic base region 32, and implant of an intrinsic base region 33 which, this time, is peripheral with respect to base contact 23.

FIG. 13B corresponds to the steps illustrated in FIG. 7 and FIG. 13C corresponds to the final state of the structure such as previously shown in FIG. 12.

The structure illustrated in FIG. 13 forms a new type of bipolar transistor entirely compatible with the process described previously and having a greatly enlarged emitter/base surface area ratio. This ratio enables a reduction in the base-collector capacitance to a minimum with respect to the base-emitter capacitance. Further, the central contacting circular structure reduces or minimizes the resistance of access to the base for a given extrinsic base surface area. Finally, it should be noted that in this structure, as in that illustrated in FIG. 12E, there is no contact between the intrinsic base and the thick oxide. This constitutes an advantage in reliability and base-collector breakdown voltage.

All these characteristics contribute to obtaining a high operating frequency and of a low noise factor.

D

LATERAL NPN TRANSISTOR

Figure 14:
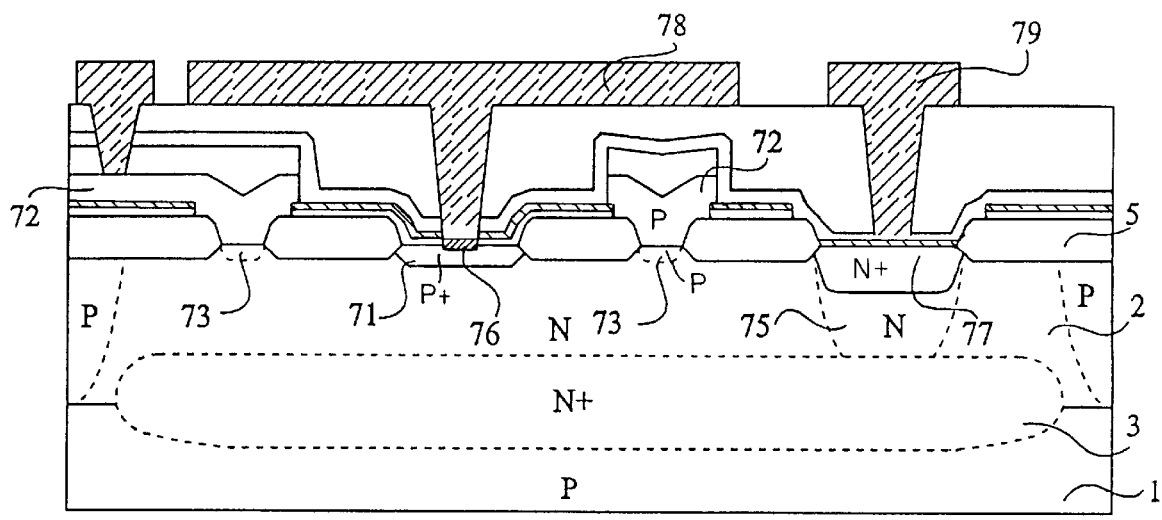
FIG. 14 shows an example of a PNP transistor which can be implemented by using the fabrication method according to the present invention.

FIG. 14 shows a structure of a lateral PNP transistor compatible with the line according to the present invention.

This transistor is formed in epitaxial layer 2 above a portion of buried layer 3 of type N$^+$. In thick oxide 5, a central opening is made, in which a P-type emitter region 71 is formed by the same implant as the sources and drains of the P-channel MOS transistors. In layer 5 is also formed an opening peripheral to this central opening. This peripheral opening is topped with a portion 72 of P-type doped polysilicon, corresponding to base polysilicon region 23 previously described. By diffusion, polysilicon portion 72 creates collector areas 73. Further, a third opening is made in the thick oxide region to form an N-type base contact well 75, at the same time as the collector well of the NPN transistor is being formed. This well 75 joins buried layer 3.

Preferably, during the silicidations steps, silicide layers 76, 77, will be created at the surface of emitter region 71 and of well 75. Emitter and base metallizations, respectively, 78 and 79, have also been shown. According to an aspect of the present invention, emitter metallization 78 extends above the base ring comprised between collector ring 73 and emitter region 71 to provide a field plate effect The gain of this PNP transistor can be optimized in various ways.

The fact that the base contact occurs via the N$^+$ buried layer is a priority a disadvantage since this N$^+$ buried layer is a recombining base area which strongly increases the base current and decreases the gain of the transistor. However, as seen previously, due to the fact that specific collector implants have been used for the NPN transistors, a relatively thick epitaxial layer 2 has been kept, which optimizes the operation of the MOS transistors and, for the PNP transistor, also helps overcoming the gain decrease effect associated with the recombining base effect.

The structure of the emitter (71, 76) is optimized. It has been indicated that emitter implant 71 was the same as that of the sources and drains of the P-channel MOS transistors. In the case where a PNP transistor is implemented in the structure, this implant dose will voluntarily be reduced, which does not constitute a disadvantage for the sources and drains of the MOS transistors which are silicided. This reduction of the concentration of the P dopings in the emitter optimizes (reduces) the base current by avoiding a direct recombination of the minority carriers (electrons) in this emitter. This effect is reinforced by the fact that silicided area 76 on emitter 71 has a reduced surface area.

The base polysilicon (designated by reference 23) which is used to form regions 72 of collector contact and diffusion, is used to establish the contact with the collector. This provides several advantages. The junction is of very high quality without defects and has a high base-collector breakdown voltage value with respect to an implanted junction. This also enables, as previously indicated, to continue metal level 78 above the collector regions. This provides a screen effect which enables a stabilization of the transistor and strongly improves its aging characteristics. Further, the screen implemented by polysilicon layer 72 stabilizes the outside of the structure between the collector and the substrate.

A PNP transistor of satisfactory characteristics which can have a gain of around 60 has thus been obtained, by using only the technological steps described previously for the formation of CMOS transistors and of an NPN transistor.

E

MOS TRANSISTOR RESISTANT TO ELECTROSTATIC DISCHARGES

Figure 15:
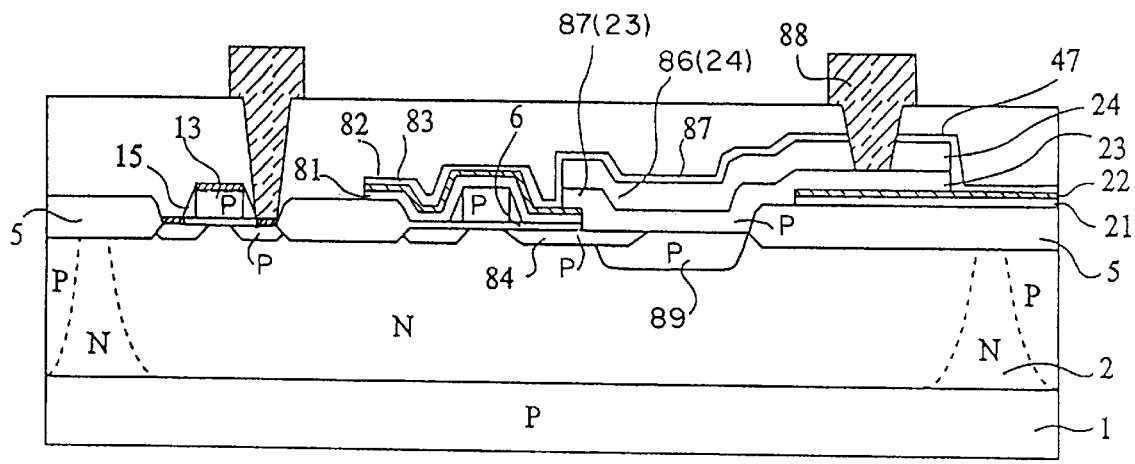
FIG. 15 shows an example of a MOS transistor resistant to overvoltages or electrostatic discharges, which can be implemented by using the fabrication method according to the present invention.

FIG. 15 shows a structure of MOS transistor resistant to electrostatic discharges and compatible with the line according to the present invention.

In the left part of the drawing, a conventional P-channel Mos transistor in which the drain, source and gate are silicided has been shown.

The transistor resistant to electrostatic discharges is formed in an opening greater than that of a conventional MOS transistor. In the left part of the drawing, a conventional drain, source, and gate structure coated with a remaining portion 81 of oxide layer 21, with a remaining portion 82 of silicon nitride layer 22, and with a remaining portion 83 of previously described silicon oxide layer 47, can be seen. Drain region 84 extends to the right of the drawing towards an opening made in layers 81, 82, towards thick oxide region 5. In this opening, a portion 85 of base polysilicon layer 23 coated with portions of oxide layers 86 and 87 corresponding to above-mentioned oxide layers 23 and 24 is left in place. These layers 85, 86, and 87 altogether extend to the right above the thick oxide (and partially above the oxide and silicon nitride layers 21 and 22) and a contact 88 is made on polysilicon layer 85 remotely from the drain region. Further, a P diffusion 88 is formed in the epitaxial layer or rather in an N well of this epitaxial layer under the region in contact with polysilicon portion 85. Thus, the use of the P-type doped base polysilicon enables creation of a P$^+$-type drain contact area, to make a junction created by high quality solid-solid diffusion, to increase the access resistance, to make a current path above an insulating area, and to implement a metallic contact away from a sensitive area formed by the PN junction. This structure has the advantage of being particularly small for a given breakdown voltage value to electrostatic discharges. It is in particular smaller than solutions conventionally used in purely CMOS technologies.

A P-channel MOS transistor structure has been described hereabove. It should be noted that a similar N-channel MOS transistor structure can be implemented by using, instead of base polysilicon 85, a portion of the emitter polysilicon layer.

F

HIGH VOLTAGE MOS TRANSISTOR

Figure 16:
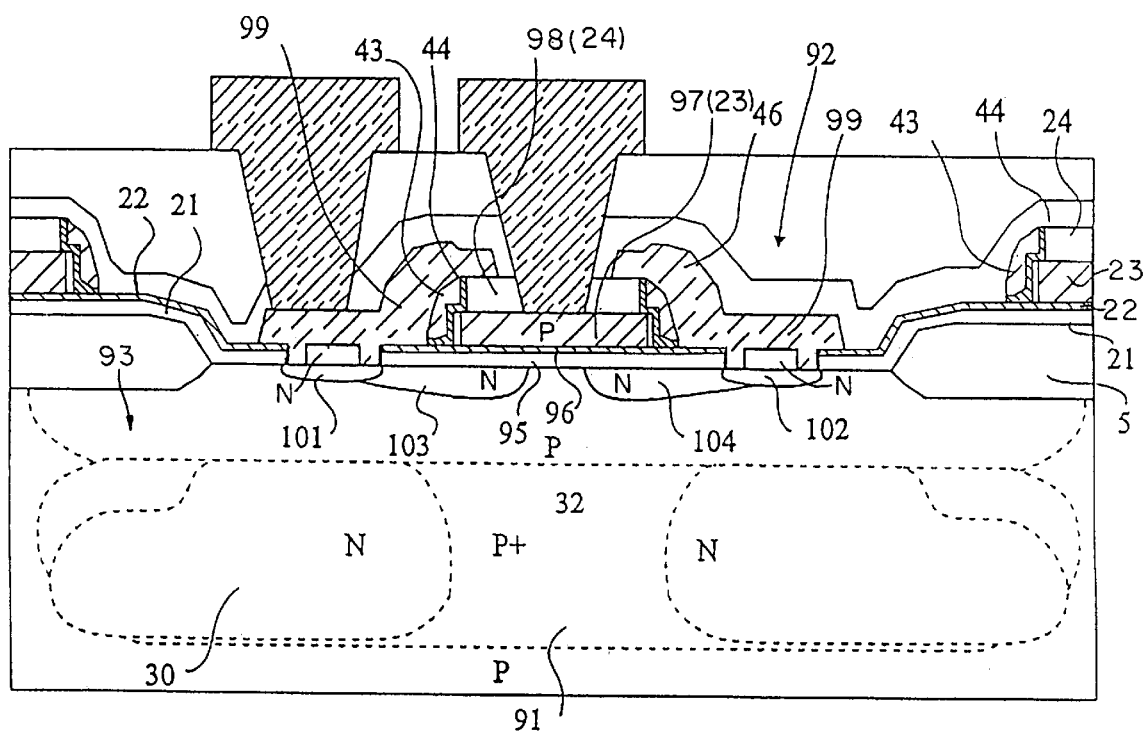
FIG. 16 shows an example of a MOS transistor which can withstand high voltages meant to be associated with a memory circuit, which can be implemented by using the fabrication method according to the present invention.

FIG. 16 shows a "high voltage" MOS transistor structure compatible with the line according to the present invention.

Indeed, in the previously described technology, integration rules impose that CMOS transistors have very thin gate oxides, typically of around 7 nm for a technology of minimal dimension of 0.35 μm. As a result, these MOS transistors withstand only supply voltages of around 3.3 volts.

However, it is desired to have elements which can resist higher voltages, for example to "high" voltages of around ten volts, especially to constitute input/output components.

To make such a component, a $P^+$-type buried layer 91 is first formed and an opening 92 is made in thick oxide 5, substantially facing this buried layer. In this opening, a P-type layer 93 is formed, at the same time as wells 9 described in relation with FIG. 2. During the steps of formation of the CMOS transistors described in relation with FIG. 3, the gate polysilicon is not formed. The drain and source diffusions (103 and 104) are however performed with an appropriate mask at the same time as for the N-channel MOS transistor of the CMOS. During the steps of formation of the protection layer including silicon oxide layer 21 and silicon nitride layer 22, these layers are deposited on the opening formed in window 92. Then, during the step of etching of this protection layer, illustrated in relation with FIG. 4, portions of protection layer 21, 22, are left in place at the internal circumference of the opening and in a central region where these portions 95, 96, of layers 21, 22 will form the gate insulation of the high voltage transistor.

In correspondence with the step illustrated in FIG. 5, P-type polysilicon layer 23 and protection oxide layer 24 are deposited and left in place in locations 97 and 98 corresponding to the gate region of the MOS transistor.

In correspondence with the step illustrated in FIG. 6, an N-type doping corresponding to the collector of the bipolar transistors is implanted. This doping penetrates into the portions open in oxide and nitride layers 21 and 22 between central region 97, 98, and the peripheral portions. However, this implant has no effect since it is essentially located in P-type highly-doped buried layer 91 where it is neutralized.

In correspondence with the steps described in relation with FIG. 7, a silicon nitride region 44 and a polysilicon spacer 43 are formed on gate sides 95, 96.

In correspondence with the step illustrated in FIG. 8, an N-type doped polysilicon layer is deposited and maintained in place at the locations designated by reference 99, that is, especially above the opening areas of protection layer 21, 22, and the N-type doping contained in this layer 99 is led to diffuse into underlying P-type well 93 to form regions of drain and source contact recovery 101, 102, which contact drain and source regions 103 and 104 previously formed.

The following steps correspond to those described previously and are not specific to this particular region where the high voltage MOS transistor is formed.

An N-channel MOS transistor with a $P^+$-type doped polysilicon gate which is not self-aligned and with $N^+$-type implanted source and drain has thus been obtained. The recovery of the contacts on these source and drain is performed by solid-solid diffusion from the emitter base polysilicon, which ensures a better reliability of the contacts, especially for a high voltage structure. The breakdown voltage value of the source and drain junctions is then high (10 volts).

It should be noted that the gate insulator is formed by a silicon oxide and silicon nitride compound having a total thickness of around 50 nm. The use of a $P^+$-type polysilicon gate enables lowering the threshold voltage of the MOS transistor which remains however relatively high, around 2 volts.

Further, due to the mixed structure (oxide/nitride) of the gate insulator, such a device can be used as an MIIS (metal-insulator-insulator-semiconductor) memory node by trapping of charges at the $SiO_2$, $Si_3N_4$ interface.

The double layer 21, 22, can be optimized according to whether it is desired to form a high voltage transistor or memory nodes in the integrated circuit.

The provided high voltage MOS transistor can be used in particular in analog circuits such as video and telephone circuits which still use voltages included between 5 and 10 V to enable to convert these levels of 5 to 10 V into signals of 3.3 V which can be processed by the CMOS components obtained according to the present invention.

Non-volatile memory nodes can be useful in analog circuits requiring a great accuracy, in which, for example, the voltage offset of an operational amplifier or the non-linearity of an analog-to-digital converter can be a problem. Then, the memory nodes will be used to create a correction "memory plane".

G

DOUBLE GATE EPROM TRANSISTOR

Figure 17:
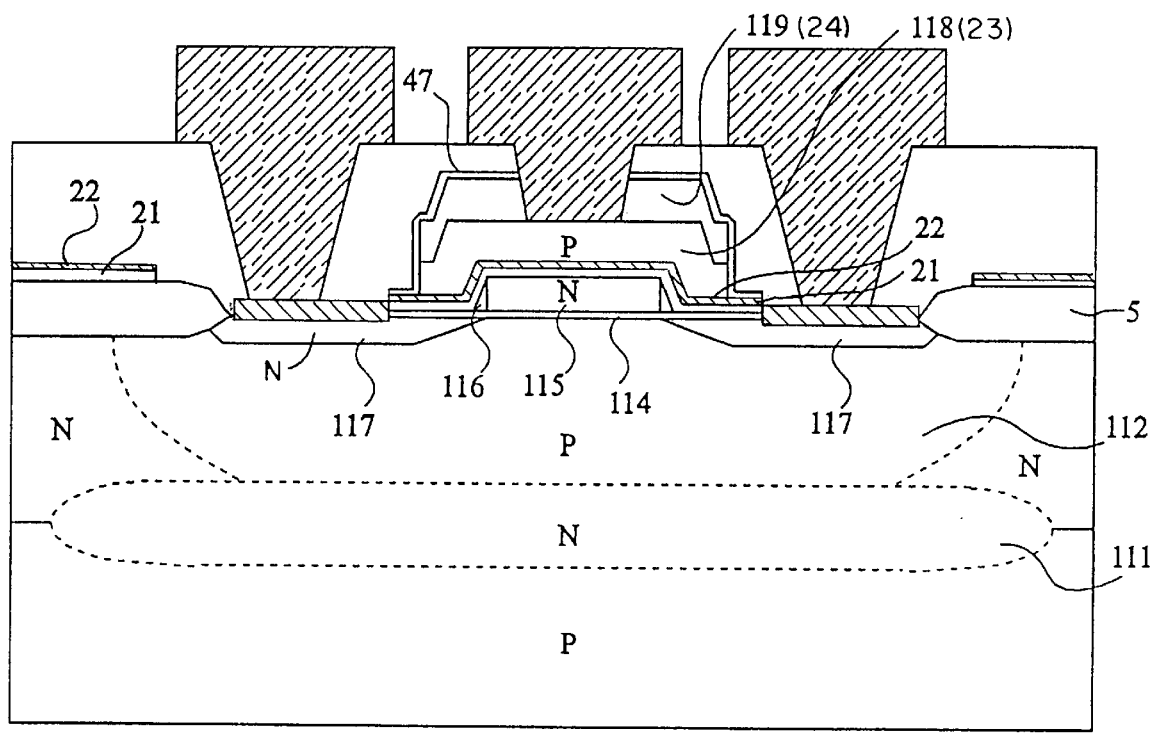
FIG. 17 shows an example of an EPROM structure which can be obtained by using the fabrication method according to the present invention.

FIG. 17 shows a structure of a double gate EPROM transistor with an insulated well likely to be used as a memory node, compatible with the line according to the present invention. This memory node is formed in an aperture made in thick oxide layer above an N-type buried layer 111, corresponding to previously described buried layer 3, in a P well 112 corresponding to previously described P well 9. The gate insulating structure 114, of first gate 115, spacers 116 and source and drain regions 117, corresponds to that of an N-channel MOS transistor described in relation with FIG. 3.

Then, the protection layer illustrated in FIG. 4 including oxide layer 21 and nitride layer 22 is deposited on the structure and, as well as base polysilicon and encapsulation layers 23 and 24, these last two layers are left in place only in regions 118 and 119 by the same etching as that described in relation with FIG. 9. Region 118 extends above above-mentioned gate polysilicon portion 115 and forms a second gate insulated from the first one by protection layer 21, 22. Afterwards, protection layer 21, 22 is opened above the drain and source regions of the structure, this opening extending above the thick oxide. A silicidation of the apparent drain and source regions is then performed and the process continues as for the other components by the formation of insulating layers and contact regions.

P-type well 112 is insulated by buried layer 111. It is thus possible to inject carriers into the floating gate from the P well, by an appropriate biasing thereof.

Those skilled in the art will note that other components can be devised while using the line according to the present invention and that this line is likely to have several alterations, modifications, and improvements. In particular, the numeric values indicated have been indicated as an example only and each material indicated as an example can be replaced with another material performing the same function (for example, etching selectivity with respect to other materials). Further, various primary components can be implemented with or without a buried layer of one or the other type of conductivity.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for fabricating an integrated circuit including complementary MOS transistors and an NPN-type bipolar transistor, comprising the steps of:

forming an N-type epitaxial layer on a P-type substrate, a buried layer being provided at least at a location of the bipolar transistor, forming a thick oxide layer at locations other than locations of wells of the MOS transistors, of a collector well region of the bipolar transistor and of a base-emitter region of the bipolar transistor, forming the wells of the MOS transistors and the collector well of the bipolar transistor, forming the insulated gates, the spacers and sources and drains of the MOS transistors, covering the entire structure, including the insulated gates, the thick oxide layer and the spacers, with a protection layer including a first layer of silicon oxide and a first layer of silicon nitride, opening the protection layer at the base-emitter location of the bipolar transistor, forming a first P-type doped layer of polysilicon or amorphous silicon and a second layer of encapsulation oxide, opening these last two layers at a center of the emitter-base region of the bipolar transistor, diffusing the dopant contained in the first silicon layer into the underlying epitaxial layer, to form the extrinsic base of the bipolar transistor, implanting an N-type collector dopant, implanting a P-type dopant to form an intrinsic base of the bipolar transistor, depositing a second silicon nitride layer, depositing a second layer of polysilicon, anisotropically etching the second polysilicon layer to leave in place spacers in the vertical portions thereof, and removing the silicon nitride, depositing a third N-type doped polysilicon layer and diffusing the dopant to form the emitter of the bipolar transistor, performing a silicidation, depositing a planarized insulating layer, and performing the metallizations.

2. A method according to claim 1, wherein the first layer of silicon oxide has a thickness of around 20 nm and the first silicon nitride layer has a thickness of around 30 nm.

3. A method according to claim 1, wherein the first silicon layer has a thickness of around 200 nm and the second silicon oxide layer has a thickness of around 300 nm.

4. A method according to claim 1, wherein the first silicon layer is obtained by deposition of undoped amorphous silicon, and then by superficial implant of $BF_2$.

5. A method according to claim 1, wherein a surface area of the collector well is doped at a same time as the sources and drains of the N-channel MOS transistors.

6. A method according to claim 1, wherein the opening of the protection layer at the emitter-base location is of smaller extent than the corresponding opening in the thick oxide.

* * * * *